(12) United States Patent
Nanba

(10) Patent No.: US 10,490,424 B2
(45) Date of Patent: Nov. 26, 2019

(54) SUBSTRATE PROCESSING APPARATUS, SUBSTRATE PROCESSING METHOD, AND STORAGE MEDIUM

(71) Applicant: TOKYO ELECTRON LIMITED, Tokyo (JP)

(72) Inventor: Hiromitsu Nanba, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/123,525

(22) Filed: Sep. 6, 2018

(65) Prior Publication Data

US 2019/0080934 A1    Mar. 14, 2019

(30) Foreign Application Priority Data

Sep. 14, 2017 (JP) ................. 2017-176844

(51) Int. Cl.
| | |
|---|---|
| *H01L 21/687* | (2006.01) |
| *H01L 21/67* | (2006.01) |
| *H01L 21/66* | (2006.01) |
| *H01L 21/306* | (2006.01) |
| *H01L 21/3213* | (2006.01) |

(52) U.S. Cl.
CPC .. *H01L 21/67063* (2013.01); *H01L 21/30604* (2013.01); *H01L 21/32134* (2013.01); *H01L 21/6708* (2013.01); *H01L 21/68764* (2013.01); *H01L 22/30* (2013.01)

(58) Field of Classification Search
CPC ......... H01L 21/30604; H01L 21/67063; H01L 21/32134; H01L 21/6708; H01L 21/68764; H01L 22/30
See application file for complete search history.

(56) References Cited

U.S. PATENT DOCUMENTS

| | | | | |
|---|---|---|---|---|
| 2001/0041229 | A1* | 11/2001 | Sakamoto | .............. B05D 1/005 427/555 |
| 2013/0223180 | A1* | 8/2013 | Komiya | .............. H01L 21/6715 366/132 |
| 2015/0318192 | A1* | 11/2015 | Ito | ..................... H01L 21/67109 438/748 |
| 2018/0012754 | A1* | 1/2018 | Nanba | ............... H01L 21/02087 |

FOREIGN PATENT DOCUMENTS

JP        2013-153135 A        8/2013

* cited by examiner

*Primary Examiner* — Dale E Page
*Assistant Examiner* — Wilner Jean Baptiste
(74) *Attorney, Agent, or Firm* — Nath, Goldberg & Meyer; Jerald L. Meyer

(57) ABSTRACT

There is provided a substrate processing apparatus including a rotary holding part configured to hold and rotate a substrate with a film formed on an upper surface of the substrate; a first supply part configured to supply a first chemical solution for etching the film to a peripheral edge portion of the upper surface of the substrate held by the rotary holding part; a second supply part configured to supply the first chemical solution to a peripheral edge portion of a lower surface of the substrate; and a third supply part configured to supply a second chemical solution, which exothermically reacts with the first chemical solution, to the peripheral edge portion of the lower surface of the substrate.

9 Claims, 9 Drawing Sheets

SUBSTRATE PROCESSING APPARATUS, SUBSTRATE PROCESSING METHOD, AND STORAGE MEDIUM

CROSS-REFERENCE TO RELATED APPLICATION

This application claims the benefit of Japanese Patent Application No. 2017-176844, filed on Sep. 14, 2017, in the Japan Patent Office, the disclosure of which is incorporated herein in its entirety by reference.

TECHNICAL FIELD

The present disclosure relates to a substrate processing apparatus, a substrate processing method, and a non-transitory computer-readable storage medium.

BACKGROUND

In the related art, there is a substrate processing apparatus including a substrate holding part for holding a substrate in a horizontal posture, a rotational driving part for rotating the substrate holding part, a first processing solution nozzle for supplying a first processing solution to a peripheral edge portion of the substrate held by the substrate holding part, and a first gas supply part for heating a first gas and supplying the first gas to the peripheral edge portion of the substrate held by the substrate holding part.

SUMMARY

Some embodiments of the present disclosure provide a substrate processing apparatus which is capable of improving the rate of etching process at a peripheral edge portion of a substrate with a simplified configuration.

According to one embodiment of the present disclosure, there is provided a substrate processing apparatus including: a rotary holding part configured to hold and rotate a substrate with a film formed on an upper surface of the substrate; a first supply part configured to supply a first chemical solution for etching the film to a peripheral edge portion of the upper surface of the substrate held by the rotary holding part; a second supply part configured to supply the first chemical solution to a peripheral edge portion of a lower surface of the substrate; and a third supply part configured to supply a second chemical solution, which exothermically reacts with the first chemical solution, to the peripheral edge portion of the lower surface of the substrate.

According to another embodiment of the present disclosure, there is provided a substrate processing method including: holding and rotating a substrate with a film formed on an upper surface of the substrate, supplying a first chemical solution for etching the film to a peripheral edge portion of the upper surface of the substrate; and supplying the first chemical solution and a second chemical solution, which exothermically reacts with the first chemical solution, to a peripheral edge portion of a lower surface of the substrate when the first chemical solution is supplied to the peripheral edge portion of the upper surface of the substrate.

According to another embodiment of the present disclosure, there is provided a non-transitory computer-readable storage medium storing a program for causing an apparatus to perform the aforementioned substrate processing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure, wherein.

DETAILED DESCRIPTION

Figure 1:
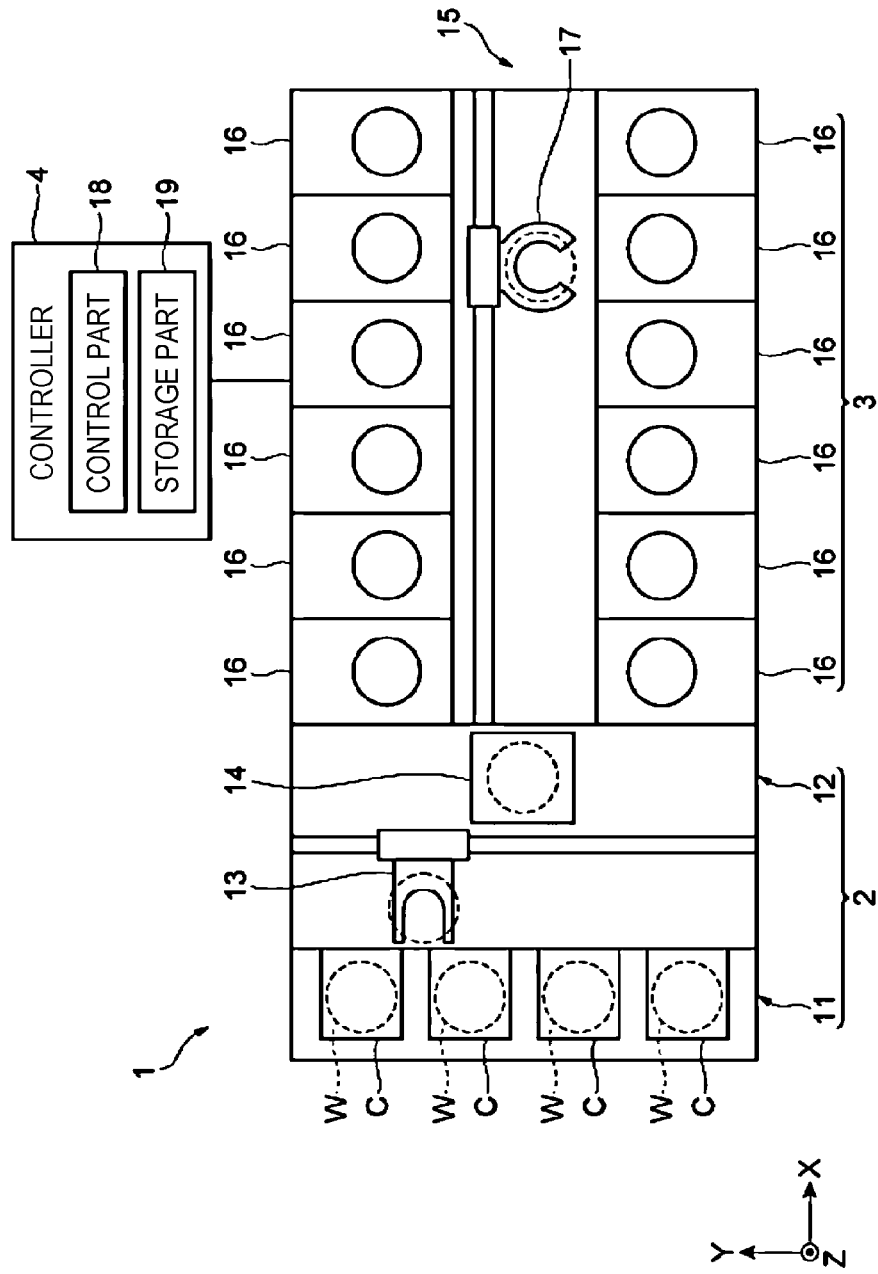
FIG. 1 is a view showing a schematic configuration of a substrate processing system.

Hereinafter, embodiments will be described in detail with reference to the drawings. In the description, the same or similar elements having the same functions will be denoted by like reference numerals, and the duplicate descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing System]

FIG. 1 is a diagram showing the schematic configuration of a substrate processing system according to the present embodiment. For the clarification of a positional relationship, an X-axis direction, a Y-axis direction and a Z-axis direction, which are orthogonal to one another, are defined in the following description and a positive Z-axis direction is defined as a vertical upward direction. As shown in FIG. 1, a substrate processing system 1 includes a carry-in/carry-out station 2 and a processing station 3. The carry-in/carry-out station 2 and the processing station 3 are located adjacent to each other.

The carry-in/carry-out station 2 includes a carrier mounting part 11 and a transfer part 12. A plurality of carriers C for horizontally accommodating a plurality of substrates, namely semiconductor wafers (hereinafter referred to as wafers W) in the present embodiment is mounted on the carrier mounting part 11.

The transfer part 12 is installed adjacent to the carrier mounting part 11, and includes a substrate transfer device 13 and a delivery part 14, which are installed inside the transfer part 12. The substrate transfer device 13 includes a wafer holding mechanism for holding the wafer W. The substrate transfer device 13 is configured to move in horizontal and vertical directions and swivel about a vertical axis so that the wafer W is transferred between the carriers C and the delivery part 14 using the wafer holding mechanism.

The processing station 3 is installed adjacent to the transfer part 12. The processing station 3 includes a transfer part 15 and a plurality of processing units 16. The plurality of processing units 16 is arranged at both sides of the transfer part 15.

The transfer part 15 includes a substrate transfer device 17 installed therein. The substrate transfer device 17 includes a wafer holding mechanism for holding the wafer W. The substrate transfer device 17 is configured to move in horizontal and vertical directions, and swivel about a vertical axis so that the wafer W is transferred between the delivery part 14 and the respective processing units 16 using the wafer holding mechanism.

The processing unit 16 performs a predetermined substrate process on the wafer W that is transferred by the substrate transfer device 17.

In addition, the substrate processing system 1 includes a controller 4. The controller 4 may be, for example, a computer, and includes a control part 18 and a storage part 19. A program for controlling various processes executed in the substrate processing system 1 is stored in the storage part 19. The control part 18 controls the operation of the substrate processing system 1 by reading and executing the program stored in the storage part 19.

Further, the program may be recorded in a computer-readable storage medium and may be installed on the storage part 19 of the controller 4 from the storage medium. Examples of the computer-readable storage medium include a hard disk (HD), a flexible disk (FD), a compact disk (CD), a magneto-optical disc (MO), a memory card, or the like.

In the substrate processing system 1 configured as above, the substrate transfer device 13 of the carry-in/carry-out station 2 picks up the wafer W from the carrier C mounted on the carrier mounting part 11, and mounts the picked-up wafer W on the delivery part 14. The wafer W mounted on the delivery part 14 is picked up from the delivery part 14 by the substrate transfer device 17 of the processing station 3 and is carried into the processing unit 16.

The wafer W carried into the processing unit 16 is processed by the processing unit 16, and is then carried out from the processing unit 16 by the substrate transfer device 17. The processed wafer W is mounted on the delivery part 14. Subsequently, the processed wafer W mounted on the delivery part 14 is returned to the carrier C of the carrier mounting part 11 by the substrate transfer device 13.

[Substrate Processing Apparatus]

Next, an example of the configuration of a substrate processing apparatus 10 included in the substrate processing system 1 will be described. The substrate processing apparatus 10 performs a process of removing, in the wafer W as a workpiece on which a film F such as a metal film or the like is formed, a portion of the film F positioned at a peripheral edge portion (a portion in the vicinity of a peripheral edge Wc) of the wafer W. An example of the film F may include a tungsten film containing tungsten. As other examples, the film F may include a titanium film, a silicide film, a titanium oxide film, a titanium nitride film, a ruthenium film, a gold film, a platinum film, and the like. The film F may be a multilayered film (a film having a plurality of layers of different compositions).

Figure 2:
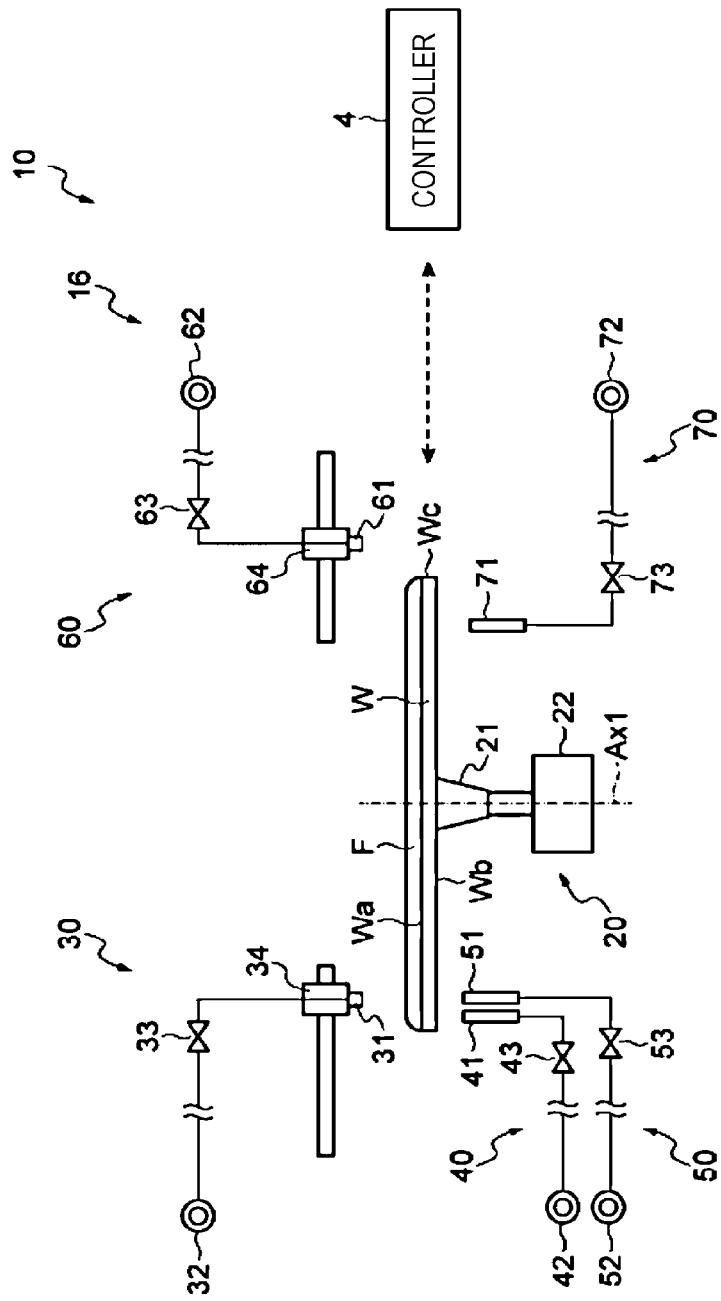
FIG. 2 is a schematic diagram showing a schematic configuration of a substrate processing apparatus.

As shown in FIG. 2, the substrate processing apparatus 10 includes the processing unit 16 and the controller 4 for controlling the processing unit 16. The processing unit 16 includes a rotation holding part 20, a first supply part 30, a second supply part 40, a third supply part 50, a fourth supply part 60, and a fifth supply part 70.

The rotation holding part 20 holds and rotates the wafer W with the film F formed on an upper surface Wa thereof. For example, the rotation holding part 20 includes a holding part 21 and a rotational driving part 22. The holding part 21 supports the wafer W which is horizontally arranged with the film F orientated upward, and holds the wafer W in, for example, a vacuum-suction manner. The rotational driving part 22 is an actuator using, for example, an electric motor as a driving source, and rotates the holding part 21 and the wafer W around a vertical axial line Ax1.

The first supply part 30 supplies a first chemical solution for etching the film F to the peripheral edge portion (the portion in the vicinity of the peripheral edge Wc) of the upper surface Wa of the wafer W held by the rotation holding part 20. For example, the first supply part 30 includes a nozzle 31, a solution supply source 32, and a valve 33.

The nozzle 31 is disposed above the upper surface Wa of the wafer W, and discharges the first chemical solution downward (and obliquely downward). The first chemical solution is, for example, a hydrogen peroxide solution. When the first chemical solution is a hydrogen peroxide solution, a component of the film F is solubilized due to adhesion of a hydroxy group. The first chemical solution is not limited to the hydrogen peroxide solution, but may be any solution as long as it can dissolve the film F. Other examples of the first chemical solution may include hydrofluoric acid, hydrochloric acid, and the like.

The solution supply source 32 supplies the first chemical solution to the nozzle 31. For example, the solution supply source 32 includes a tank (not shown) which receives the first chemical solution, and a pump (not shown) which forcibly feeds the first chemical solution from the tank to the nozzle 31. The valve 33 is, for example, an air-operated valve, which opens and closes a flow path of the first chemical solution, which extends from the solution supply source 32 to the nozzle 31. A nozzle driving part 34 moves the nozzle 31 along a direction crossing (for example, orthogonal to) the rotational center (the axial line Ax1) of the wafer W using, for example, an electric motor or the like as a driving source.

The second supply part 40 supplies the first chemical solution to a peripheral edge portion (the portion in the vicinity of the peripheral edge Wc) of a lower surface Wb of the wafer W. For example, the second supply part 40 includes a nozzle 41, a solution supply source 42, and a valve 43.

The nozzle 41 is disposed below the peripheral edge portion of the lower surface Wb of the wafer W, and discharges the first chemical solution upward (and obliquely upward). The solution supply source 42 supplies the first chemical solution to the nozzle 41. For example, the solution supply source 42 includes a tank (not shown) which receives the first chemical solution and a pump (not shown) which forcibly feeds the first chemical solution from the tank to the nozzle 41. The valve 43 is, for example, an air-operated valve, which opens and closes a flow path of the first chemical solution, which extends from the solution supply source 42 to the nozzle 41.

The third supply part 50 supplies a second chemical solution that exothermically reacts with the first chemical solution to the peripheral edge portion of the lower surface Wb of the wafer W. The third supply part 50 is configured to discharge the second chemical solution, which is not mixed with the first chemical solution, so that the second chemical solution is not mixed with the first chemical solution at the peripheral edge portion of the lower surface Wb of the wafer W. The third supply part 50 may be configured such that the second chemical solution reaches a position closer to the rotational center (the axial line Ax1) of the wafer W than a position where the first chemical solution supplied from the second supply part 40 reaches the wafer W.

For example, the third supply part 50 includes a nozzle 51, a solution supply source 52, and a valve 53. The nozzle 51 is disposed below the peripheral edge portion of the lower surface Wb of the wafer W, and discharges the second chemical solution upward (and obliquely upward). The nozzle 51 is positioned closer to the rotational center of the wafer W than the nozzle 41 of the second supply part 40 so that the second chemical solution reaches a position closer to the rotational center of the wafer W than a position where the first chemical solution discharged from the second supply part 40 reaches the wafer W.

The second chemical solution may be any solution as long as it can exothermically react with the first chemical solution. When the first chemical solution is a hydrogen peroxide solution or hydrofluoric acid, sulfuric acid may be used as an example of the second chemical solution that can be combined with the first chemical solution. When the first chemical solution is hydrochloric acid, a nitric acid aqueous solution may be used as an example of the second chemical solution that can be combined with the first chemical solution.

The solution supply source 52 supplies the second chemical solution to the nozzle 51. For example, the solution supply source 52 includes a tank (not shown) which receives the second chemical solution and a pump (not shown) which forcibly feeds the second chemical solution from the tank to the nozzle 51. The valve 53 is, for example, an air-operated valve, which opens and closes a flow path of the second chemical solution, which extends from the solution supply source 52 to the nozzle 51.

The fourth supply part 60 supplies a processing solution for rinsing process (hereinafter referred to as "rinsing solution") for washing off the first chemical solution, the second chemical solution, and the dissolved component of the film F to the peripheral edge portion of the upper surface Wa of the wafer W. For example, the fourth supply part 60 includes a nozzle 61, a solution supply source 62, and a valve 63. The nozzle 61 is disposed above the upper surface Wa of the wafer W, and discharges the rinsing solution downward (and obliquely downward). A specific example of the rinsing solution may include pure water (DIW). The solution supply source 62 supplies the rinsing solution to the nozzle 61. For example, the solution supply source 62 includes a tank (not shown) which receives the rinsing solution and a pump (not shown) which forcibly feeds the rinsing solution from the tank to the nozzle 61. The valve 63 is, for example, an air-operated valve, which opens and closes a flow path of the rinsing solution, which extends from the solution supply source 62 to the nozzle 61. The nozzle driving part 64 moves the nozzle 61 along a direction crossing (for example, orthogonal to) the rotational center (the axial line Ax1) of the wafer W using, for example, an electric motor as a driving source.

The fifth supply part 70 supplies the rinsing solution to the peripheral edge portion of the lower surface Wb of the wafer W. For example, the fifth supply part 70 includes a nozzle 71, a solution supply source 72, and a valve 73. The nozzle 71 is disposed below the peripheral edge portion of the lower surface Wb of the wafer W, and discharges the rinsing solution upward (and obliquely upward). The solution supply source 72 supplies the rinsing solution to the nozzle 71. For example, the solution supply source 72 includes a tank (not shown) which receives the rinsing solution and a pump (not shown) which forcibly feeds the rinsing solution from the tank to the nozzle 71. The valve 73 is, for example, an air-operated valve, which opens and closes a flow path of the rinsing solution, which extends from the solution supply source 72 to the nozzle 71.

The controller 4 (control part) is configured to control the first supply part 30 to supply the first chemical solution to the peripheral edge portion of the upper surface Wa of the wafer W, to control the second supply part 40 to supply the first chemical solution to the peripheral edge portion of the lower surface Wb of the wafer W when the first chemical solution is supplied to the peripheral edge portion of the upper surface Wa of the wafer W, and to control the third supply part 50 to supply the second chemical solution to the peripheral edge portion of the lower surface Wb of the wafer W when the first chemical solution is supplied to the peripheral edge portions of the upper surface Wa and the lower surface Wb of the wafer W. In some embodiments, the controller 4 may be configured to control the second supply part and the third supply part so that a ratio of the first chemical solution and the second chemical solution, which reach the lower surface Wb of the wafer W, is adjusted according to the type of film to be processed.

Figure 3:
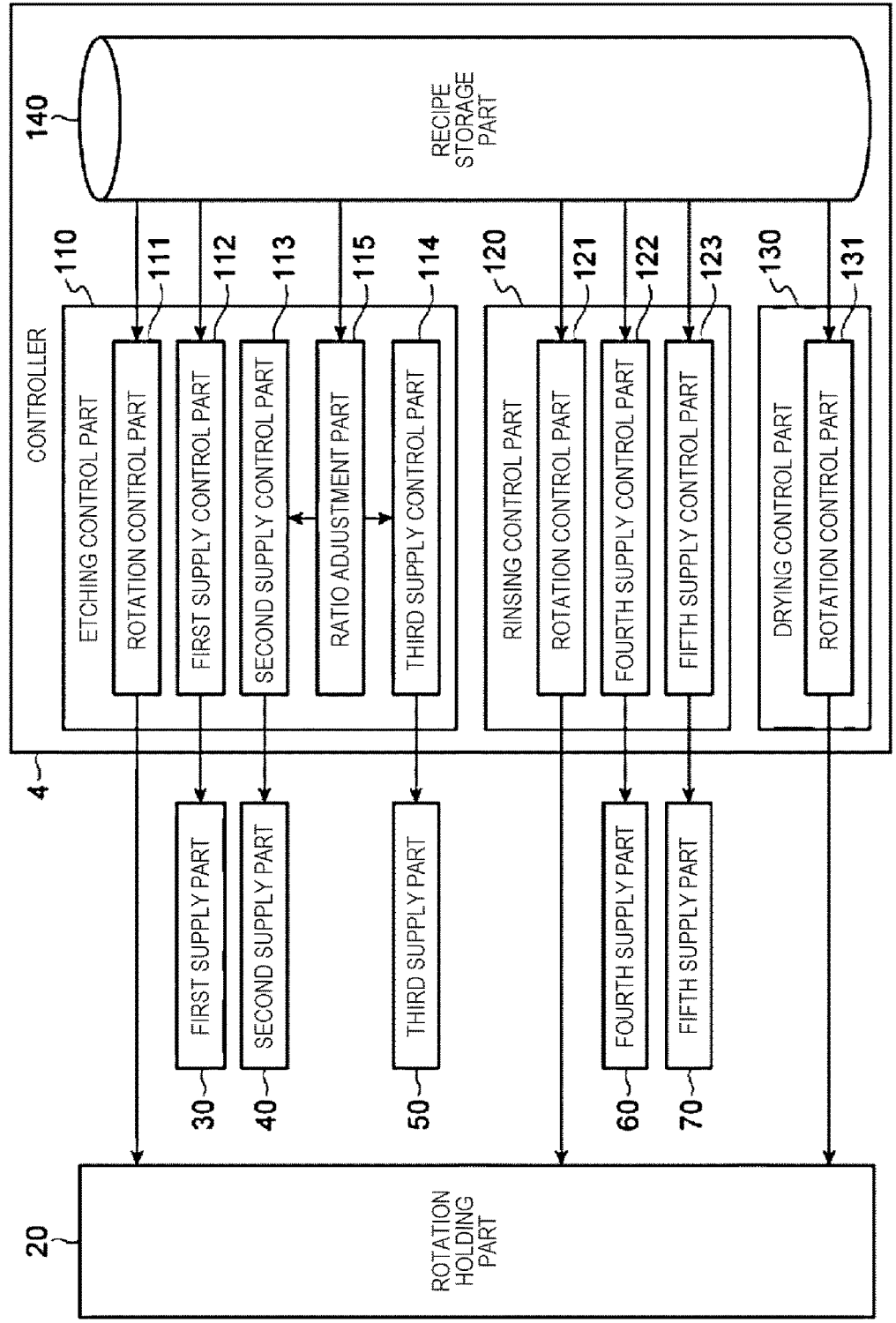
FIG. 3 is a block diagram showing a functional configuration of a control part.

As shown in FIG. 3, for example, the controller 4 includes, as functional components (hereinafter referred to as "functional modules"), an etching control part 110, a rinsing control part 120, a drying control part 130, and a recipe storage part 140.

The etching control part 110 controls the processing unit 16 to perform an etching process of supplying the first chemical solution to the peripheral edge portion of the upper surface Wa of the wafer W and supplying the first chemical solution and the second chemical solution to the peripheral edge portion of the lower surface Wb of the wafer W. The etching control part 110 includes a rotation control part 111, a first supply control part 112, a second supply control part 113, a third supply control part 114, and a ratio adjustment part 115, as more detailed functional modules.

The rotation control part 111 controls the rotation holding part 20 to rotate the wafer W at a rotation speed adapted for the etching process. The first supply control part 112 controls the first supply part 30 to supply the first chemical solution to the peripheral edge portion of the upper surface Wa of the wafer W. When the first chemical solution is supplied to the peripheral edge portion of the upper surface Wa of the wafer W, the second supply control part 113 controls the second supply part 40 to supply the first chemical solution to the peripheral edge portion of the lower surface Wb of the wafer W. When the first chemical solution is supplied to the peripheral edge portions of the upper surface Wa and the lower surface Wb of the wafer W, the third supply control part 114 controls the third supply part 50 to supply the second chemical solution to the peripheral edge portion of the lower surface Wb of the wafer W.

The ratio adjustment part 115 controls the second supply part 40 and the third supply part 50 so that a ratio of the first chemical solution and the second chemical solution, which reach the lower surface Wb of the wafer W, is adjusted according to the type of the film F to be processed. When the film F is a multilayered film, the ratio adjustment part 115 may change the ratio of the first chemical solution and the second chemical solution, which reach the lower surface Wb of the wafer W, according to which layer of the multilayered film is to be processed. For example, the ratio adjustment part 115 sets a target value (hereinafter referred to as "target mixing ratio") of the ratio of the first chemical solution and the second chemical solution, which reach the lower surface Wb of the wafer W, according to the type of the film F, and controls the second supply part 40 and the third supply part 50 using the second supply control part 113 and the third supply control part 114 so that a ratio (hereinafter referred to as "discharge amount ratio") of the discharge amount of the first chemical solution from the nozzle 41 to the discharge amount of the second chemical solution from the nozzle 51 approaches the target mixing ratio. The target mixing ratio according to the type of the film F can be set by referring to a table stored in advance.

The rinsing control part 120 controls the processing unit 16 to perform a rinsing process of supplying the rinsing solution to the peripheral edge portions of the upper surface Wa and the lower surface Wb of the wafer W. The rinsing control part 120 includes a rotation control part 121, a fourth supply control part 122, and a fifth supply control part 123 as more detailed functional modules. The rotation control part 121 controls the rotation holding part 20 to rotate the wafer W at the rotation speed adapted for the rinsing process. The fourth supply control part 122 controls the fourth supply part 60 to supply the rinsing solution to the peripheral edge portion of the upper surface Wa of the wafer W. When the rinsing solution is supplied to the peripheral edge portion of the upper surface Wa of the wafer W, the fifth supply control part 123 controls the fifth supply part 70 to supply the rinsing solution to the peripheral edge portion of the lower surface Wb of the wafer W.

The drying control part 130 controls the processing unit 16 to perform a drying process of the wafer W which has been subjected to the rinsing process. The drying control part 130 includes a rotation control part 131 as a more detailed functional module. The rotation control part 131 controls the rotation holding part 20 to rotate the wafer W at a rotation speed adapted for the drying process.

The recipe storage part 140 stores predetermined parameters to define conditions for the etching process, the rinsing process, and the drying process. The parameters include rotation speeds of the wafer W for the respective processes, a supply duration time of the first chemical solution and the second chemical solution in the etching process (hereinafter referred to as "etching time"), a supply duration time of the rinsing solution in the rinsing process (hereinafter referred to as "rinsing time"), a rotation duration time of the wafer W in the drying process (hereinafter referred to as "drying time"), and the like.

[Substrate Processing Method]

Next, a substrate process procedure executed by the substrate processing apparatus 10 will be described as an example of a substrate processing method. The substrate process procedure includes holding and rotating the wafer W with the film F formed on the upper surface Wa thereof, supplying the first chemical solution to the peripheral edge portion of the upper surface Wa of the wafer W, and supplying the first chemical solution and the second chemical solution to the peripheral edge portion of the lower surface Wb of the wafer W when the first chemical solution is supplied to the peripheral edge portion of the upper surface Wa of the wafer W.

Figure 4:
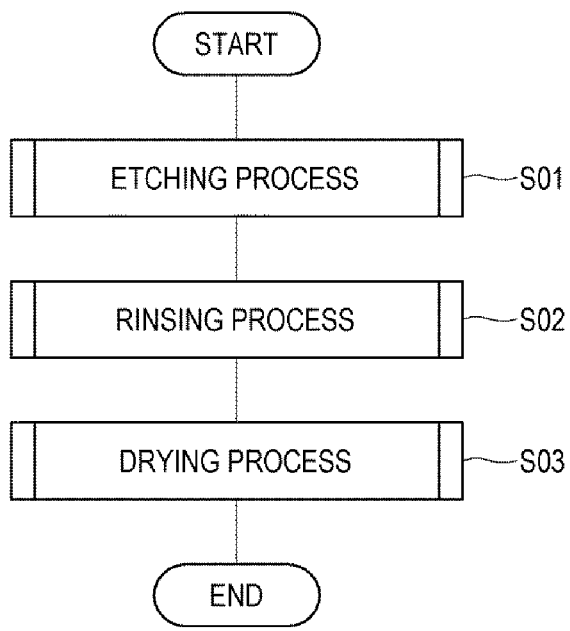
FIG. 4 is a flowchart showing a substrate process procedure.

In the substrate process procedure, the controller 4 sequentially executes steps S01, S02 and S03 shown in FIG. 4. In step S01, the etching control part 110 controls the processing unit 16 to perform the etching process. In step S02, the rinsing control part 120 controls the processing unit 16 to perform the rinsing process. In step S03, the drying control part 130 controls the processing unit 16 to perform the drying process. Hereinafter, the specific description of an etching process procedure in step S01, a rinsing process procedure in step S02, and a drying process procedure in step S03 will be made.

(Etching Process Procedure)

Figure 5:
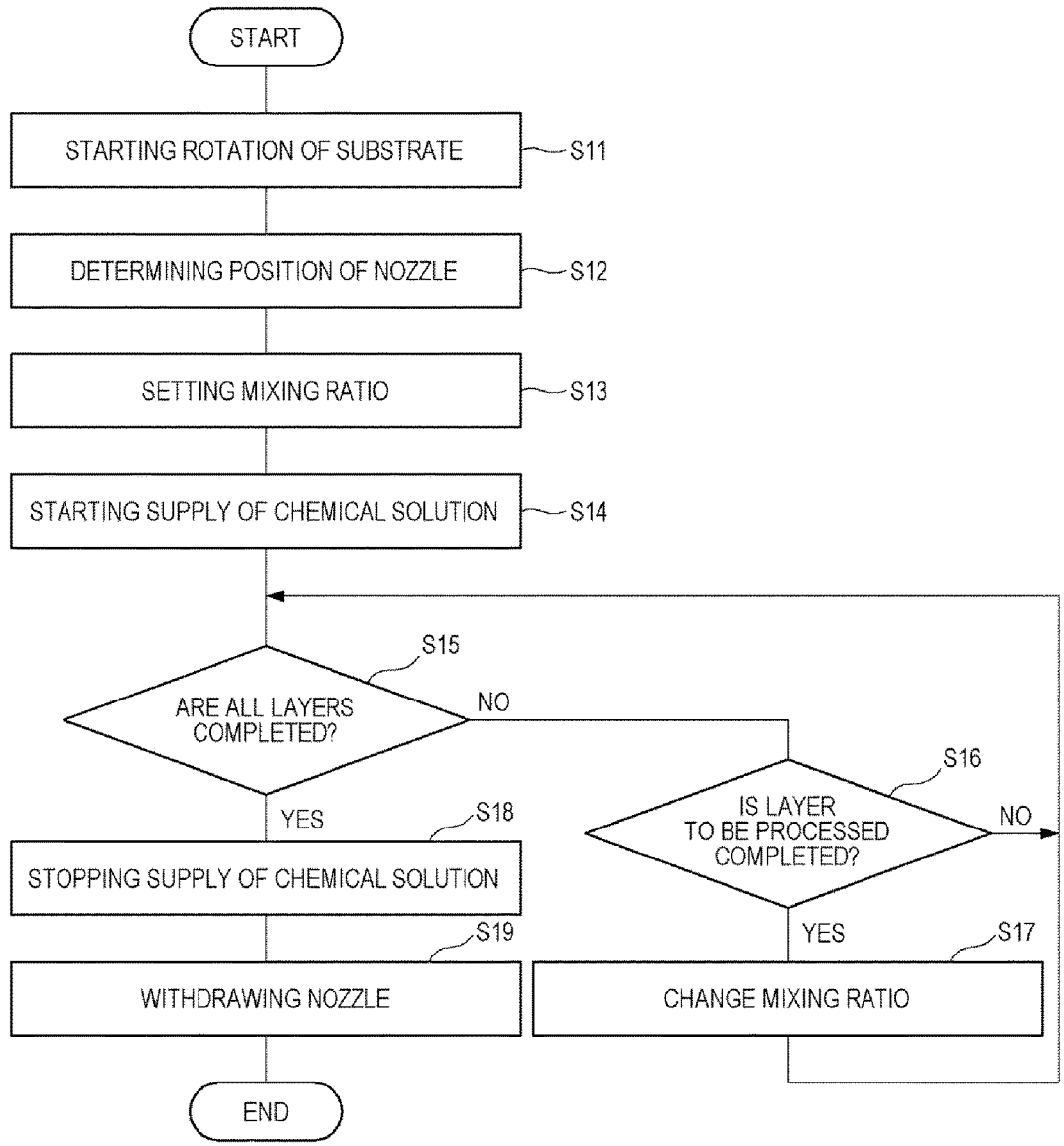
FIG. 5 is a flowchart showing an etching process procedure.
Figure 8A:
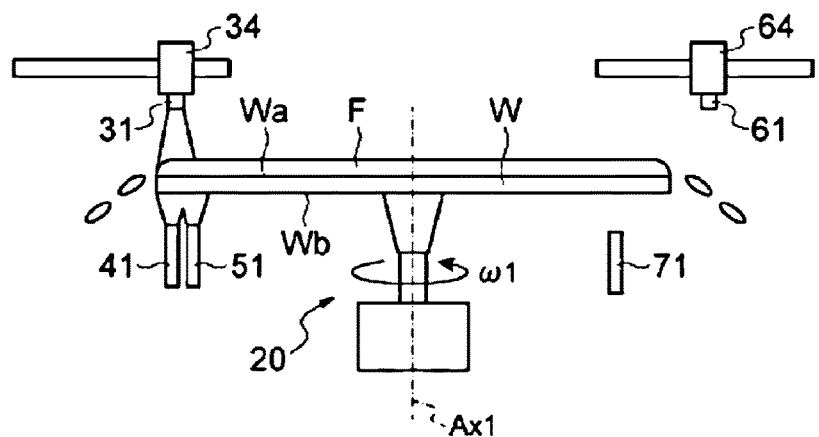
FIGS. 8A to 8C are schematic diagrams showing the state of a wafer during execution of the substrate process procedure.

FIG. 5 is a flowchart showing an etching process procedure when the film F is a multilayered film. As shown in FIG. 5, the etching control part 110 sequentially executes steps S11, S12, and S13. In step S11, the rotation control part 111 controls the rotation holding part 20 to rotate the wafer W at an etching process rotational speed oil stored in the recipe storage part 140 (see FIG. 8A). In step S12, the first supply control part 112 controls the first supply part 30 so that the nozzle 31 is disposed above the upper surface Wa of the wafer W by the nozzle driving part 34. In step S13, the ratio adjustment part 115 sets the target mixing ratio according to the type of film (the type of the uppermost layer of the film F) to be processed, by referring to information on the type of the film F, which is stored in the recipe storage part 140. For example, the ratio adjustment part 115 sets the target mixing ratio so that a temperature of the peripheral edge portion of the wafer W becomes a temperature suitable for processing the film to be processed. The execution order of steps S11, S12, and S13 may be changed as appropriate.

Subsequently, the etching control part 110 executes step S14. In step S14, the first supply control part 112 controls the first supply part 30 to open the valve 33 and to start discharge of the first chemical solution from the nozzle 31, the second supply control part 113 controls the second supply part 40 to open the valve 43 and to start discharge of the first chemical solution from the nozzle 41, and the third supply control part 114 controls the third supply part 50 to open the valve 53 and to start discharge of the second chemical solution from the nozzle 51 (see FIG. 8A).

Figure 9:
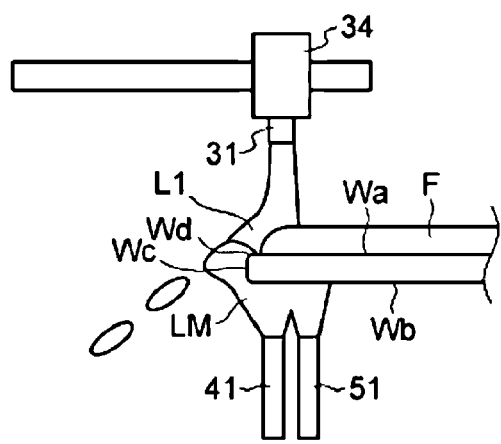
FIG. 9 is an enlarged schematic diagram showing a peripheral edge portion of the wafer during execution of the substrate process procedure.

Subsequently, the second supply control part 113 and the third supply control part 114 control the second supply part 40 and the third supply part 50 so that the ratio of the discharge amount approaches the target mixing ratio set by the ratio adjustment part 115 (for example, adjust the opening degree of the valves 43 and 53). That is to say, the ratio adjustment part 115 controls the second supply part 40 and the third supply part 50 using the second supply control part 113 and the third supply control part 114 so that the ratio of the discharge amount approaches the target mixing ratio. At this time, as shown in FIG. 9, the controller 4 may control the flow rates of the chemical solutions supplied from the first supply part 30, the second supply part 40, and the third supply part 50 so that a mixed solution LM of the first chemical solution supplied from the second supply part 40 and the second chemical solution supplied from the third supply part 50 flows around from the peripheral edge portion of the lower surface Wb of the wafer to the peripheral edge portion of the upper surface Wa of the wafer W, and collides with the first chemical solution L1 supplied from the first supply part 30 at the peripheral edge portion of the upper surface Wa. A region Wd to which the mixed solution LM flows around the upper surface Wa may be fixed or changed during the process, but may be positioned outward of an outer peripheral end of the film F.

Subsequently, the etching control part 110 executes step S15. In step S15, the ratio adjustment part 115 determines whether the etching process on all layers of the film F has been completed. In step S15, if it is determined that a layer in which the etching process has not been completed remains, the etching control part 110 executes step S16. In step S16, the ratio adjustment part 115 determines whether the etching process on the layer to be processed is completed. For example, the ratio adjustment part 115 determines whether the etching time for the respective layer stored in the recipe storage part 140 has elapsed.

In step S16, if it is determined that the etching process on the respective layer has not been completed, the etching control part 110 allows the procedure to return to step S15. In step S16, if it is determined that the etching process on the layer to be processed has been completed, the etching control part 110 executes step S17. In step S17, the ratio adjustment part 115 changes the target mixing ratio according to the type of layer lying under the layer to be processed. Subsequently, the etching control part 110 allows the procedure to return to step S15. Thereafter, until the etching process for all layers of the film F is completed, the supply of the first chemical solution to the peripheral edge portion of the upper surface Wa and the supply of the first chemical solution and the second chemical solution to the peripheral edge portion of the lower surface Wb are continued, while the ratio of the discharge amount is changed according to which layer of the multilayered film is to be processed.

If it is determined in step S15 that the etching process for all layers of the film F has been completed, the etching control part 110 executes steps S18 and S19. In step S18, the first supply control part 112 controls the first supply part 30 to close the valve 33 and to stop the discharge of the first chemical solution from the nozzle 31, the second supply control part 113 controls the second supply part 40 to close the valve 43 and to stop the discharge of the first chemical solution from the nozzle 41, and the third supply control part 114 controls the third supply part 50 to close the valve 53 and to stop the discharge of the second chemical solution from the nozzle 51. In step S19, the first supply control part 112 controls the first supply part 30 to withdraw the nozzle 31 from the peripheral edge portion of the upper surface Wa by the nozzle driving part 34. In this way, the etching procedure is completed. The execution order of steps S18 and S19 may be changed as appropriate.
(Rinsing Process Procedure)

Figure 6:
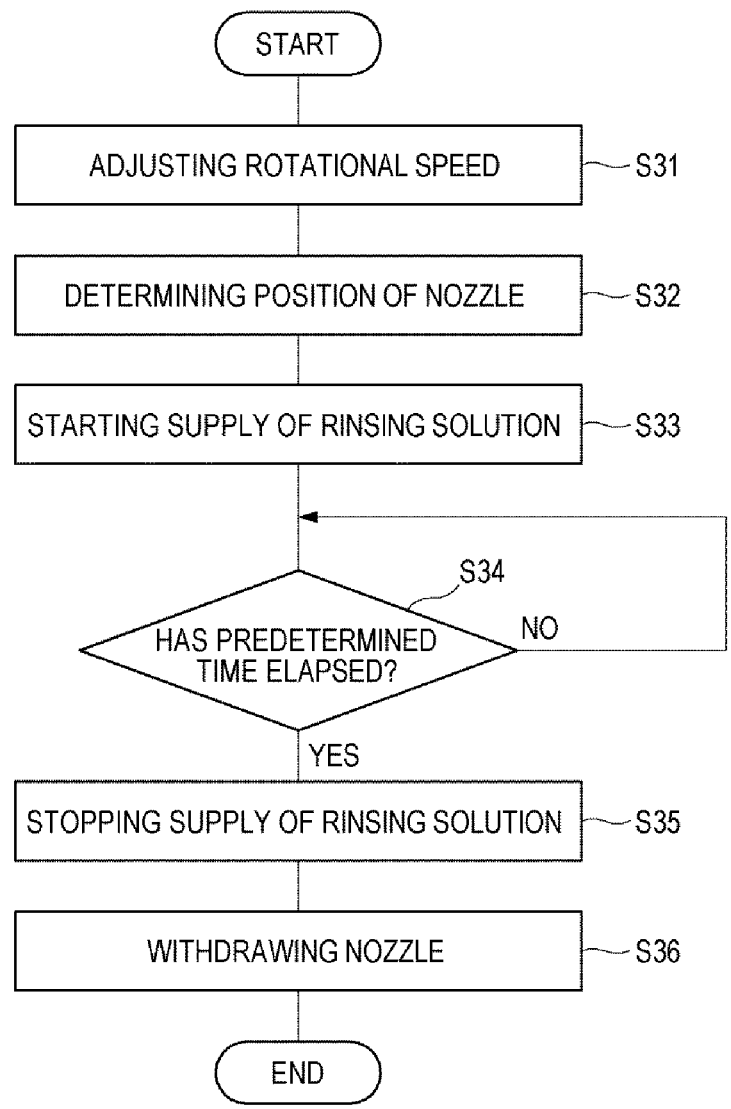
FIG. 6 is a flowchart showing a rinsing process procedure.
Figure 8B:
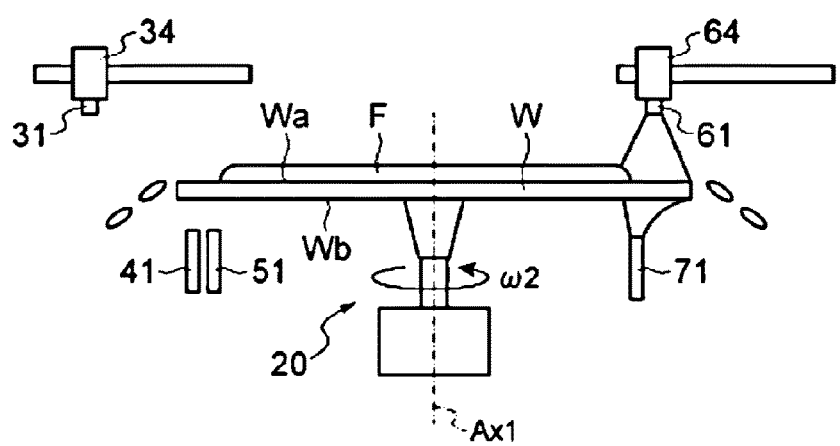

As shown in FIG. 6, the rinsing control part 120 sequentially executes steps S31, S32, and S33. In step S31, the rotation control part 121 controls the rotation holding part 20 to change the rotational speed of the wafer W to a rinsing process rotational speed w2 stored in the recipe storage part 140 (see FIG. 8B). In step S32, the fourth supply control part 122 controls the fourth supply part 60 so that the nozzle 61 is disposed above the upper surface Wa of the wafer W by the nozzle driving part 64. In step S33, the fourth supply control part 122 controls the fourth supply part 60 to open the valve 63 and to start discharge of the rinsing solution from the nozzle 61 (see FIG. 8B). In addition, the execution order of steps S31 and S32 may be changed as appropriate.

Subsequently, the rinsing control part 120 sequentially executes steps S34, S35, and S36. In step S34, the fourth supply control part 122 determines whether the rinsing time stored in the recipe storage part 140 elapses. In step S35, the fourth supply control part 122 controls the fourth supply part 60 to close the valve 63 and to stop the discharge of the rinsing solution from the nozzle 61. In step S36, the fourth supply control unit 122 controls the fourth supply part 60 to withdraw the nozzle 61 from the peripheral edge portion of the upper surface Wa by the nozzle driving part 64. In this way, the rinsing process procedure is ended. The execution order of steps S35 and S36 may be changed as appropriate.
(Drying Process Procedure)

Figure 7:
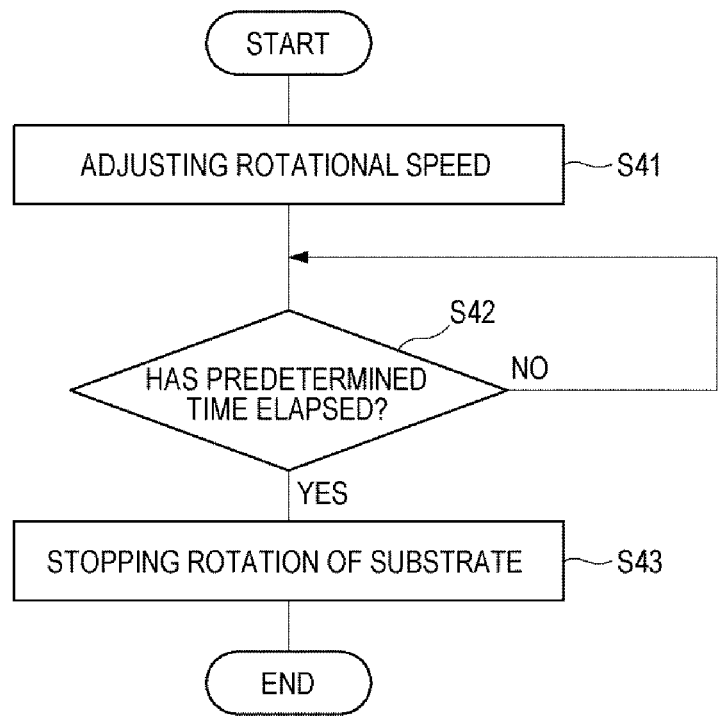
FIG. 7 is a flowchart showing a drying process procedure.
Figure 8C:
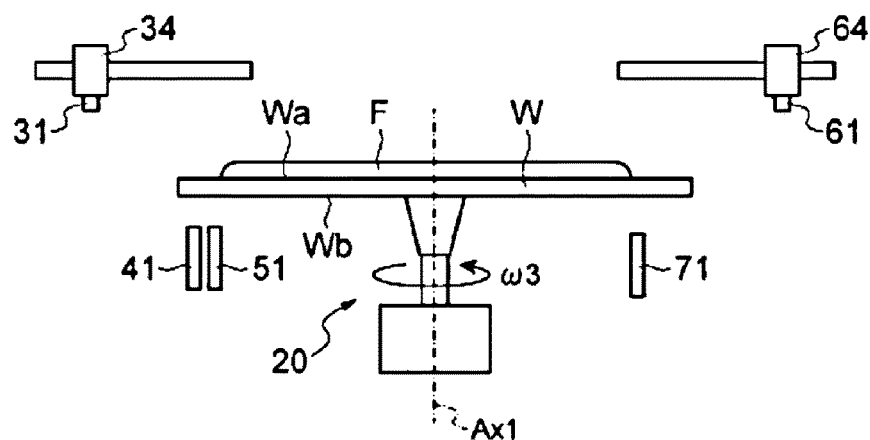

As shown in FIG. 7, the drying control part 130 sequentially executes steps S41, S42, and S43. In step S41, the rotation control part 131 controls the rotation holding part 20 to change the rotational speed of the wafer W to a drying process rotational speed w3 stored in the recipe storage part 140 (see FIG. 8C). In step S42, the rotation control part 131 determines whether the drying time stored in the recipe storage part 140 elapses. In step S43, the rotation control part 131 controls the rotation holding part 20 to stop the rotation of the wafer W. In this way, the drying procedure is ended.

Effects of Embodiments

As described above, the substrate processing apparatus 10 includes the rotation holding part 20 configured to hold and rotate the wafer W with the film F formed on the upper surface Wa thereof, the first supply part 30 configured to supply the first chemical solution for etching the film F to the peripheral edge portion of the upper surface Wa of the wafer W held by the rotation holding part 20, a second supply part 40 configured to supply the first chemical solution to the peripheral edge portion of the lower surface Wb of the wafer W, and the third supply part 50 configured to supply the second chemical solution exothermically reacting with the first chemical solution to the peripheral edge portion of the lower surface Wb of the wafer W.

According to the substrate processing apparatus 10, when the first supply part 30 supplies the first chemical solution to the peripheral edge portion of the upper surface Wa of the wafer W, the second supply part 40 and the third supply part 50 are configured to supply the first chemical solution and the second chemical solution to the peripheral edge portion of the lower surface Wb of the wafer W, respectively. The first chemical solution and the second chemical solution supplied to the lower surface Wb of the wafer W are mixed with each other and exothermically react with each other. This heats the peripheral edge portion of the wafer W, thus facilitating the etching process by the first chemical solution on the upper surface Wa of the wafer W. In this way, the peripheral edge portion of the wafer W can be heated by supplying the first chemical solution and the second chemical solution to the lower surface Wb in a simplified structure, thereby improving the speed of the solution process.

The third supply part 50 may be configured such that the second chemical solution reaches a position closer to the rotational center of the wafer W than a position where the first chemical solution supplied from the second supply part 40 reaches the wafer W. This makes it possible to suppress the dilution of the first chemical solution due to the second chemical solution on the peripheral edge of the wafer W and the side of the upper surface Wa of the wafer W. Therefore, the speed of the solution process can be more reliably improved.

The substrate processing apparatus 10 further includes the controller 4 configured to control the first supply part 30 to supply the first chemical solution to the peripheral edge portion of the upper surface Wa of the wafer W, to control the second supply part 40 to supply the first chemical solution to the peripheral edge portion of the lower surface Wb of the wafer W when the first chemical solution is supplied to the peripheral edge portion of the upper surface Wa of the wafer W, and to control the third supply part 50 to supply the second chemical solution to the peripheral edge portion of the lower surface Wb of the wafer W when the first chemical solution is supplied to the peripheral edge portion of the upper surface Wa of the wafer W and the peripheral edge portion of the lower surface Wb of the wafer W. With this configuration, it is possible to automatically supply the first chemical solution and the second chemical solution to the peripheral edge portion of the lower surface Wb of the wafer W using the second supply part 40 and the third supply part 50 when the first chemical solution is supplied to the peripheral edge portion of the upper surface Wa of the wafer W. This improves the usability of the substrate processing apparatus 10.

The controller 4 is configured to control the second supply part 40 and the third supply part 50 to adjust the ratio of the first chemical solution and the second chemical solution, which reach the lower surface Wb of the wafer W, according to the type of the film F to be processed. With this configuration, it is possible to adjust a heating amount of the peripheral edge portion of the wafer W according to the type of the film F to be processed.

Further, the film F may be a multilayered film. The controller 4 is configured to change the ratio of the first chemical solution and the second chemical solution, which reach the lower surface Wb of the wafer W, according to which layer of the multilayered film is to be processed. With this configuration, it is possible to adjust a heating amount of the peripheral edge portion of the wafer W for each layer of the multilayered film.

Further, the controller 4 is configured to control the first supply part 30, the second supply part 40, and the third supply part 50 so that a mixed solution of the first chemical solution supplied from the second supply part 40 and the second chemical solution supplied from the third supply part 50 flows around from the peripheral edge portion of the lower surface Wb of the wafer W to the peripheral edge portion of the upper surface Wa of the wafer W and collides with the first chemical solution supplied from the first supply part 30 at the peripheral edge portion of the upper surface Wa. With this configuration, the first chemical solution supplied from the first supply part 30 tends to stay at the peripheral edge portion of the upper surface Wa of the wafer W while being heated, thereby further improving the speed of solution process.

Although embodiments have been described above, the present disclosure is not necessarily limited to the above-described embodiments, and various modifications may be made without departing from the spirit of the present disclosure. For example, the substrate to be processed is not limited to a semiconductor wafer, but may be a glass substrate, a mask substrate, a Flat Panel Display (FPD), or the like.

As described above, according to the embodiments of the present disclosure, it is possible to improve the speed of etching process at a peripheral edge portion of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a rotary holding part configured to hold and rotate a substrate with a film formed on an upper surface of the substrate;
   a first supply part configured to supply a first chemical solution for etching the film to a peripheral edge portion of the upper surface of the substrate held by the rotary holding part;
   a second supply part configured to supply the first chemical solution to a peripheral edge portion of a lower surface of the substrate; and
   a third supply part configured to supply a second chemical solution, which exothermically reacts with the first chemical solution, to the peripheral edge portion of the lower surface of the substrate, such that the second chemical solution reaches a position closer to a rotational center of the substrate than a position where the first chemical solution supplied from the second supply part reaches the substrate.

2. The substrate processing apparatus of claim 1, further comprising a controller configured to control:
   the first supply part to supply the first chemical solution to the peripheral edge portion of the upper surface of the substrate;
   the second supply part to supply the first chemical solution to the peripheral edge portion of the lower surface of the surface when the first chemical solution is supplied to the peripheral edge portion of the upper surface of the substrate; and
   the third supply part to supply the second chemical solution to the peripheral edge portion of the lower surface of the substrate when the first chemical solution is supplied to the peripheral edge portion of the upper surface of the substrate and the peripheral edge portion of the lower surface of the substrate.

3. The substrate processing apparatus of claim 2, wherein the controller further controls the second supply part and the third supply part so that a ratio of the first chemical solution and the second chemical solution, which reach the lower surface of the substrate, is adjusted according to a type of the film to be processed.

4. The substrate processing apparatus of claim 2, wherein the controller further controls the first supply part, the second supply part, and the third supply part so that a mixed solution of the first chemical solution supplied from the second supply part and the second chemical solution supplied from the third supply part flows around the peripheral edge portion of the lower surface of the substrate to the peripheral edge portion of the upper surface of the substrate and collides with the first chemical solution supplied from the first supply part at the peripheral edge portion of the upper surface of the substrate.

5. The substrate processing apparatus of claim 3, wherein the film is a multilayered film, and the controller is configured to change the ratio of the first chemical solution and the second chemical solution, which reach the lower surface of the substrate, according to which layer of the multilayered film is to be processed.

6. The substrate processing apparatus of claim 1, wherein the film contains tungsten, the first chemical solution contains a hydrogen peroxide, and the second chemical solution contains a sulfuric acid.

7. A substrate processing method comprising:
   holding and rotating a substrate with a film formed on an upper surface of the substrate,
   supplying a first chemical solution for etching the film to a peripheral edge portion of the upper surface of the substrate; and
   supplying the first chemical solution and a second chemical solution, which exothermically reacts with the first chemical solution, to a peripheral edge portion of a lower surface of the substrate when the first chemical solution is supplied to the peripheral edge portion of the upper surface of the substrate, such that the second chemical solution reaches a position closer to a rotational center of the substrate than a position where the first chemical solution supplied to the lower surface of the substrate reaches the substrate.

8. The substrate processing method of claim 7, further comprising:
adjusting a ratio of the first chemical solution and the second chemical solution, which reach the lower surface of the substrate, according to a type of the film to be processed.

9. A non-transitory computer-readable storage medium storing a program for causing an apparatus to perform the substrate processing method of claim 7.

* * * * *